(12) United States Patent
Uayanagi et al.

(10) Patent No.: US 6,281,033 B1
(45) Date of Patent: Aug. 28, 2001

(54) SEMICONDUCTOR DYNAMIC QUANTITY-SENSOR AND METHOD OF MANUFACTURING THE SAME

(75) Inventors: Katsumichi Uayanagi; Mitsuo Sasaki; Mutsuo Nishikawa; Shiho Katsumi, all of Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/471,712

(22) Filed: Dec. 23, 1999

(30) Foreign Application Priority Data

Dec. 24, 1998 (JP) .................................. 10-366314

(51) Int. Cl.[7] ...................... H01L 21/00; H01L 21/302; C23F 1/00
(52) U.S. Cl. .............................. 438/50; 438/52; 438/739; 216/2; 216/92
(58) Field of Search ................... 438/48, 50, 51, 438/52, 53, 461, 611, 739, 906; 216/2, 92, 95, 99; 134/2, 3; 156/643; 73/54.61, 721, 517

(56) References Cited

U.S. PATENT DOCUMENTS 4,740,410 * 4/1988 Muller et al. ..................... 428/133
5,482,564 * 1/1996 Douglas et al. .................... 134/18
5,677,785 * 10/1997 Koo et al. ......................... 359/291
5,706,122 * 1/1998 Lim .................................. 359/291

FOREIGN PATENT DOCUMENTS

| 7-209105 | 8/1995 | (JP) . |
| 7-245414 | 9/1995 | (JP) . |
| 02000114219A | * 4/2000 | (JP) . |
| WO 98/21536 | 10/1993 | (WO) . |

* cited by examiner

Primary Examiner—John F. Niebling
Assistant Examiner—Viktor Simkovic
(74) Attorney, Agent, or Firm—Rossi & Associates

(57) ABSTRACT

A method and apparatus for manufacturing a semiconductor physical quantity sensor according to the present invention achieves the high sensing accuracy and reliability and prevents a sticking phenomenon. Specifically, a semiconductor physical quantity sensor is cleaned by a displacement liquid and is dried while a SOI substrate is revolving. The number of revolutions is determined so that a suction force ($F_s$), which acts on a silicon substrate by a surface tension of the displacement liquid, a sensor spring force $F_K$ and a centrifugal force ($F_r$) generated by the acceleration in the revolution can satisfy the following condition: $(F_K+F_r)>F_S$. In order to prevent the sticking phenomenon after the stop of the spray, the semiconductor physical quantity sensor is dried by spraying an inert gas such as nitrogen including minus ions so that the revolving SOI substrate can eliminate static electricity generated by friction of the air flow.

11 Claims, 15 Drawing Sheets

A

B

C

D

E

F

A

B

C

D

E

F

A

B

C

D

E

F

G

H

A

B

C

D

E

F

SEMICONDUCTOR DYNAMIC QUANTITY-SENSOR AND METHOD OF MANUFACTURING THE SAME

FIELD OF THE INVENTION

The present invention relates to a method and apparatus for manufacturing a semiconductor physical quantity sensor that senses physical quantities such pressure, acceleration and angular velocity.

DESCRIPTION OF RELATED ART

FIGS. 7(a)–(b) show the essential structure of a conventional semiconductor physical quantity sensor. FIG. 7(a) is a plan view, and FIG. 7(b) is a sectional view cut along line Y—Y in FIG. 7(a).

As shown in FIGS. 7(a)–(b), an SOI substrate 100 consists of a silicon substrate 1, an oxide film 2 and a silicon layer 3 (a single crystal layer or a polysilicon layer). A semiconductor physical quantity sensor is formed in the silicon layer 3, which is the third layer on the SOI substrate 100. The semiconductor physical quantity sensor consists of a sensing element 103, a digital adjustment circuit 104, an analog amplifier circuit 105, an input/output terminal 106 and a digital adjustment terminal 107. The sensing element 103 is warped as indicated by an arrow in FIG. 7(b) by pressure, acceleration and angular velocity. The semiconductor physical quantity sensor sensing physical quantities such as pressure, acceleration and angular velocity by amplifying electric signals generated by the warp.

FIGS. 8(a)–(b) show the essential structure of a conventional sensing element. FIG. 8(a) is a plan view, and FIG. 8(b) is a sectional view cut along line B—B in FIG. 8(a).

In FIGS. 8(a)–(b), the oxide film 2 at the bottom of the sensing element 103, which is arranged at the center of the silicon layer 3, is removed in order to allow weight portions 110a, 110b of the sensing element 103 to move freely. The sensing element 103 comprises four beams 111a, 111b, 111c, 111d with semiconductor strain gauges 113a, 113b, 113c, 113d; the weight portions 110a, 110b with holes 15 for etching the oxide film as a sacrifice layer; and four beams 111e, 111f, 111g, 111h that support the weight portions 110a, 110b and have no semiconductor strain gauge. The weight portions 110a, 110b deform the eight beams. The semiconductor strain gauges 113a, 113b, 113c, 113d sense the deformations of the four beams 111a, 111b, 111c, 111d with the semiconductor strain gauges, and convert the deformations into electric signals. As shown in FIGS. 8(a)–(b), the sensing element 103 is composed of the silicon layer 3 having the holes 15, and the sensing element 103 sticks on the silicon substrate 1 through the oxide film 2. The sensing element 103 is supported at a position where it sticks on the silicon substrate 1 (the position is not shown in FIG. 8(a)).

FIG. 9 is a circuit diagram showing the semiconductor physical quantity sensor. An analog amplifier circuit 105 amplifies an output voltage of a Wheatstone bridge, which is composed of the four semiconductor strain gauges 113a, 113b, 113c, 11 3d. The digital adjustment circuit 104 adjusts the sensitivity and the temperature characteristics.

A description will now be given of the operation of an acceleration sensor, which is an example of the semiconductor physical quantity sensor. If a force generated by the vertical acceleration is applied to the semiconductor physical quantity sensor, a compressive stress acts on the two semiconductor strain gauges 113b, 113d of the four semiconductor strain gauges 113a, 113b, 113c, 113d to decrease their resistance. On the other hand, a tensile stress acts on the two semiconductor strain gauges 113a, 113c to increase their resistance. The change in the resistance causes the Wheatstone bridge circuit to output a sensor signal corresponding to the acceleration. Vcc indicates a high potential of a power supply voltage; GND indicates a ground potential; and V+ and Vindicate a positive potential and a negative potential, respectively.

FIGS. 10 and 11 are sectional views showing steps A–F in order in a conventional method for manufacturing the semiconductor physical quantity sensor.

At the step A, an insulating layer of the oxide film 2 such as BPSG film or PSG film is formed on the silicon substrate 1, and the silicon layer 3 made of polysilicon or the like is formed on the oxide film 2 to thereby construct a SOI substrate 100. Although not illustrated in the drawings, the previously-mentioned semiconductor strain gauges, the analog amplifier circuit 105, the digital adjustment circuit 104, the input/output terminal 106, the digital adjustment terminal 107, or the like are formed in the silicon layer 3.

At the step B, a resist film 4 is coated and patterned on the silicon layer 3. Then, a number of holes 15 are formed in the silicon layer 3 by wet etching using mixed acid of hydrofluoric acid (HF) or by dry etching using mixed gas of nitric acid ($HNO_3$), and sulfur hexafluoride ($SF_6$) and oxygen ($O_2$), thus forming the sensing element 103 (indicated by an arrow). The sensing element 103 is formed in the silicon layer 3 including the weight portions 110.

At the step C, the oxide film 2, which is the sacrifice layer opposite to the bottom of the silicon layer 3, is removed by an etching liquid 5 such as HF.

At the step D, the sensing element 103 is cleaned by a displacement liquid 6 such as pure water and isopropyl alcohol (IPA), and then the displacement liquid 6 is vaporized to dry the sensing element 103. In the drying process, a surface tension of the displacement liquid 6 generates a suction force 7 toward the silicon substrate 1.

At the step E, the weight portions 110 of the sensing element 103 formed in the silicon layer 3 made of polysilicon with low rigidity are sucked and stuck on the silicon substrate 1 by the suction force 7. This is called a sticking phenomenon.

At the step F, the resist film is ashen and removed while the weight portions 110 stick on the silicon substrate 1.

If the weight portions 110 stick on the silicon substrate 1 in the sticking phenomenon, the physical quantity sensor is useless.

A description will now be given of a manufacturing method that prevents the sticking phenomenon (Japanese Patent Publication No. 7-505743).

FIGS. 12 and 13 are sectional views showing steps A–F in order in a conventional method for manufacturing the semiconductor physical quantity sensor. This method is disclosed in Japanese Patent Publication No. 7-505743.

At the step A, a sacrifice layer of an oxide film 2 such as BPSG and PSG is formed on a silicon substrate 1, and a silicon layer 3 made of polysilicon is formed on the oxide film 2.

At the step B, a resist film 4 is coated and patterned on the silicon layer 3, and a sensing element 103 is formed in the silicon layer 3.

At the step C, an etching liquid 5 etches the oxide film 2 in such a manner as to partially remain that the oxide film 2 as the sacrifice layer just below the silicon layer 3.

The silicon layer 3 sticks on the silicon substrate 1 through the remaining oxide film 2.

At the step D, a photosensitive polymer 15 is coated and patterned in such a manner as to fill up a part A, from which the oxide film 2 as the sacrifice layer between the silicon layer 3 and the silicon substrate 1 has already been removed.

At the step E, an etching liquid 13 etches the remaining oxide film 2 in order to remove the oxide film 2 from a part B.

At the step F, the etching liquid 13 at the part where the oxide film 2 has already been removed is substituted with a displacement liquid 6 to dry the part B. At this time, a surface tension of the displacement liquid 6 causes a suction force 27 to act on the silicon substrate 1 as indicated by an arrow. This does not result in the sticking phenomenon in which the weight portions 100 of the sensing element 103 stick on the silicon substrate 1 at a position 30 inside the circle, because the photosensitive polymer 15 has a high rigidity.

FIG. 13(c) shows the dried sensing element 103. The weight portions 110 never stick on the silicon substrate 1 at the step G.

At the step H, the photosensitive polymer 15 and the resist film 4 are removed in the drying process such as ashing, thereby manufacturing the sensing element 103 with movable weight portions 100.

There is another method for manufacturing a sensing element, and this will now be described.

FIGS. 14 and 15 are sectional views showing steps A–F in order in another conventional method for manufacturing a semiconductor physical quantity sensor. This method is disclosed in Japanese Patent Provisional Publication Nos. 7-209105 and 7-245414.

The steps A–C are the same as the steps A–C in FIG. 10.

At the step D, an etching liquid 5 is substituted with a displacement liquid (not illustrated), and a sublimation substance 30 such as palladichrolobenzene and naphthalene is liquidated. The displacement liquid is substituted with the sublimation substance 30 in such a manner that the sublimation substance 30 can fill up a space between the silicon substrate 1 and the silicon layer 3. Then, the sublimation substance 30 is fixed.

At the step E, the sublimation substance 30 is sublimed.

At the step F, the resist film 4 is removed in the drying process such as ashing, thereby manufacturing a sensing element 103.

If the photosensitive polymer 15 holds the sensing element 103 during the drying, it is difficult to uniformly fill up the space between the silicon layer 3 and the silicon substrate 1 with the photosensitive polymer 15 because the patterning accuracy is deteriorated by an unevenness of several μm on the surface of the photosensitive polymer 15. Moreover, if the photosensitive polymer 15 filled between the silicon layer 3 and the silicon substrate 1 is not completely removed in the drying process, a residue 31 stays behind. This lowers the percentage of non-defective articles and increases the manufacturing cost.

If the photosensitive polymer 15 stays behind between the silicon layer 3 and the silicon substrate 1, the movable range of the weight portions 110 of the sensing element 103 is narrowed, and this deteriorates the sensing accuracy and reliability. Moreover, there is the necessity for etching the oxide film 2 of the sacrifice layer twice and patterning the photosensitive polymer 15, and this increases the manufacturing cost.

If the sublimation substance 30 holds the sensing element during the drying, the sublimation substance 30 cannot be removed completely. Therefore, an alien substance 32 mixed in the sublimation substance 30 may remain. This deteriorates the sensing accuracy and reliability.

In view of the foregoing, it is an object of the present invention to prevent the sticking phenomenon and improve the sensing accuracy and reliability.

SUMMARY OF THE INVENTION

The invention accomplishes the above object by providing a physical quantity sensor manufacturing method, which uses a SOI substrate composed of a silicon substrate as a first layer, an insulating layer as a second sacrifice layer formed on the first layer, and a silicon or polysilicon layer as a third layer formed on the second layer, and which comprises machining the third layer to form a sensing element for sensing physical quantities and removes the second layer to form a semiconductor physical quantity sensor, the method comprising the steps of: coating the third layer with protective film; forming a sensing element by using the protective film as a mask; removing the second sacrifice layer by wet etching; substituting an etching liquid used in the wet etching with a displacement liquid; drying the sensing element by removing the displacement liquid sticking on the sensing element in a state wherein an acceleration in an opposite direction to a direction toward the first layer is applied to the sensing element; and removing the protective film by dry etching.

An acceleration to be applied to the sensing element is preferably obtained by a centrifugal force generated by revolving the SOI substrate.

The sensing element is preferably dried so that a suction force of the sensing element against the first layer due to a surface tension of the displacement liquid, the centrifugal force ($F_S$) and a spring force $F_K$ of the sensing element can satisfy the following condition: $(F_r+F_K)>F_S$.

Thus, the acceleration in a direction opposite to the direction of the spring force generated by revolving the SOI substrate and the spring force generated at the base of the weight portions of the sensing element exceed the suction force generated by the surface tension of the displacement liquid, and this prevents the sticking phenomenon.

Preferably, the displacement liquid is stuck on the sensing element until the acceleration reaches a predetermined value, and the displacement liquid is removed and the sensing element is dried after the acceleration reaches the predetermined value.

This prevents the sticking phenomenon during the low-speed revolution.

The sensing element is preferably dried by an inert gas.

Preferably, the first layer is electrically connected with the second layer, and the SOI substrate is revolved.

This prevents the sticking phenomenon since the static electricity generated between the wafer and the surrounding air during the revolution is canceled by minus ions or is shifted toward the first layer.

The displacement liquid is preferably vapor, pure water or isopropyl alcohol (IPA).

A manufacturing apparatus for use in the above-mentioned semiconductor physical quantity sensor manufacturing method preferably comprise at least a rotary shaft, a drying tank and a support plate for fixing the SOI substrate, and at least either one of the rotary shaft and the drying tank has holes for spraying the displacement liquid.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings.

Figure 1A:
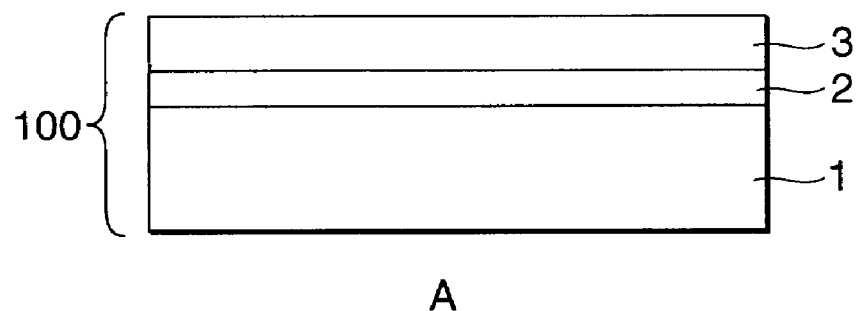
FIGS. 1(a)–(c) are sectional views showing the essential parts of the steps in a semiconductor physical quantity sensor manufacturing method according to the first embodiment of the present invention.
Figure 1B:
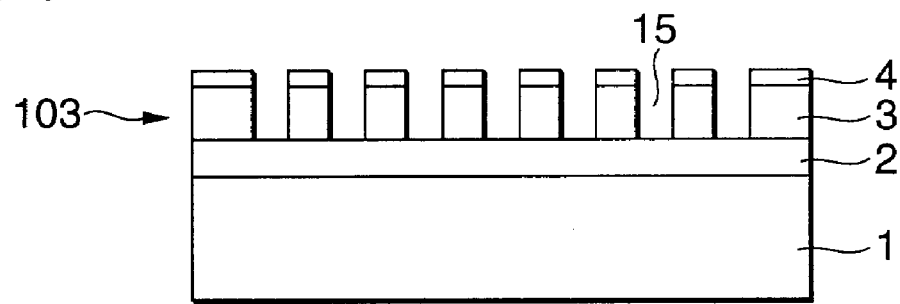
Figure 1C:
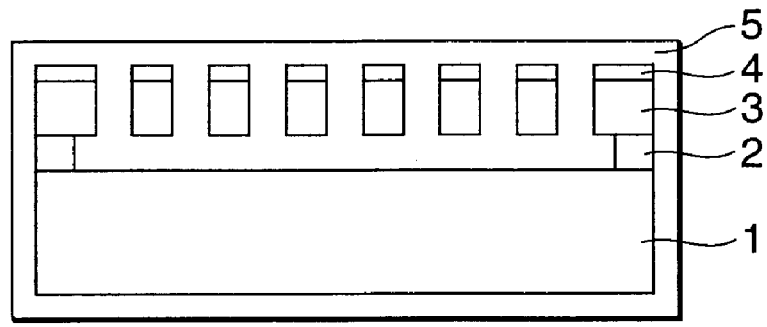
Figure 2A:
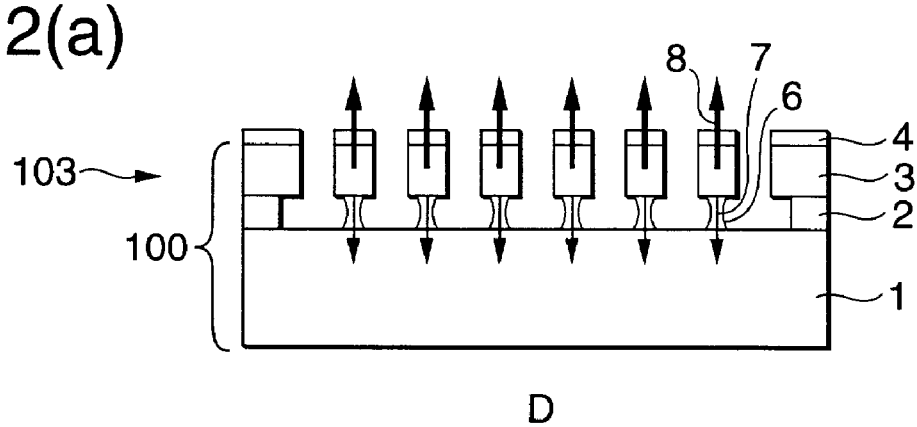
FIGS. 2(a)–(c) are sectional views showing the essential parts of the steps in a semiconductor physical quantity sensor manufacturing method according to the first embodiment of the present invention.
Figure 2B:
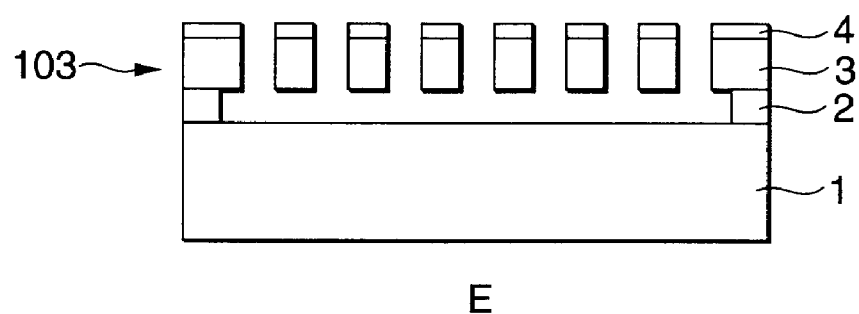
Figure 2C:
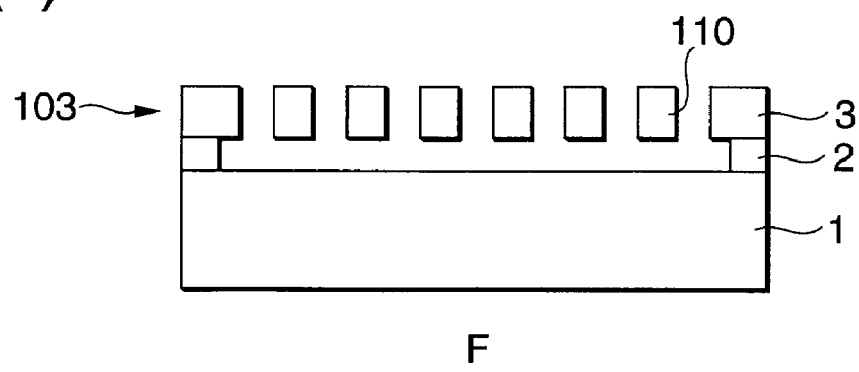
Figure 8A:
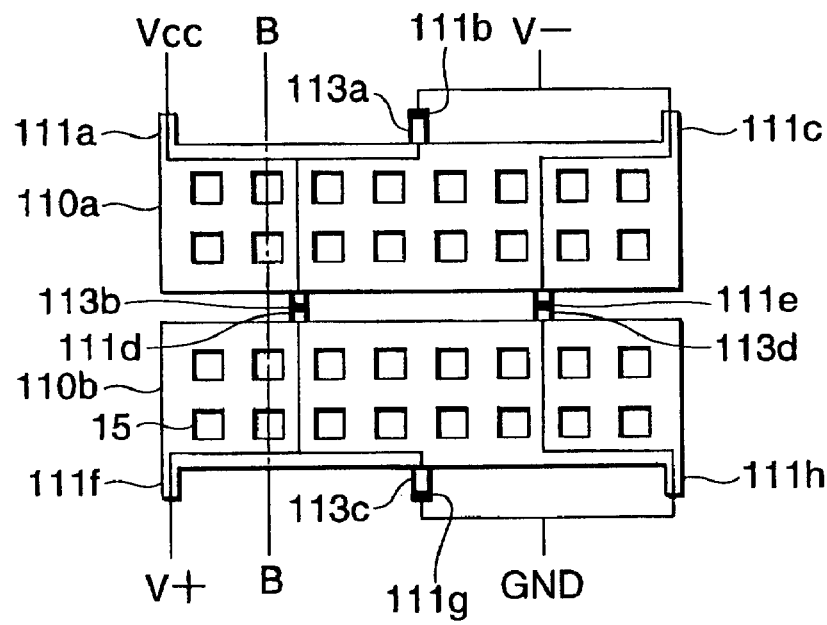
FIGS. 8(a)–(b) are views showing the essential structure of conventional sensing element, FIG. 8(a) being a plan view and FIG. 8(b) being a sectional view cut along line B—B in FIG. 8(a)

FIGS. 1 and 2 are essential portion sectional views showing the steps A–F in order in a method for manufacturing a semiconductor physical quantity sensor according to the first embodiment of the present invention. The sections in FIGS. 1 and 2 are obtained by cutting the semiconductor physical quantity sensor along line B—B in FIG. 8(a).

Figure 7A:
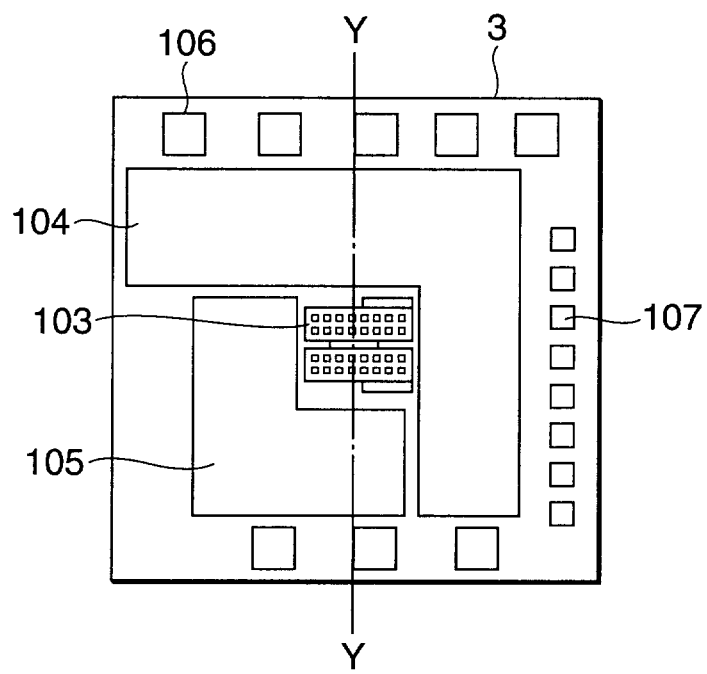
FIGS. 7(a)–(b) are views showing the essential structure of a conventional semiconductor physical quantity sensor, FIG. 7(a) being a plan view and FIG. 7(b) being a sectional view cut along line Y—Y in FIG. 7(a)
Figure 7B:
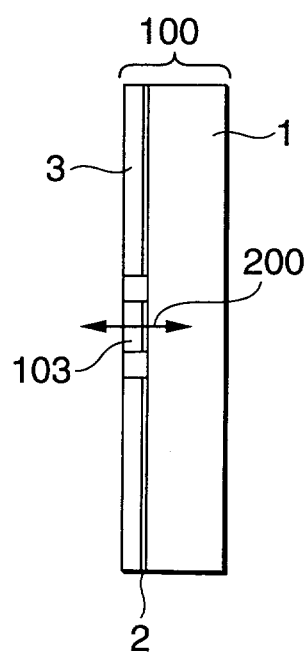

At the step A, an oxide film 2 such as BPSG or PSG is formed on a silicon substrate 1, and a silicon layer 2 made of polysilicon or the like is formed on the oxide film 2 to construct a SOI substrate 100. Although not illustrated, the silicon layer 3 includes a sensing element 103 composed of the strain gauges in FIG. 7; an analog amplifier circuit 105; a digital adjustment circuit 104; an input/output terminal 106; and a digital adjustment terminal 107. The sectional views described below show the sensing element 103.

At the step B, a resist film 4 is coated and patterned on the silicon layer 3. A number of holes are formed in the silicon layer 3 by wet etching using mixed acid of hydrofluoric acid (HF) or by dry etching using mixed gas of nitric acid ($HNO_3$), and sulfur hexafluoride ($SF_6$) and oxygen ($O_2$), thus forming the sensing element 103 in the silicon layer 3. The plane pattern of the sensing element 103 is the same as in FIG. 8(a).

At the step C, the oxide film 2, which is a sacrifice layer opposite to the bottom of the silicon layer 3, is removed by an etching liquid 5 such as HF in such a manner that both ends of the oxide film 2 can partially remain. The etching liquid 5 flows into the oxide film 2 through the holes 15 to etch the oxide film 2.

At the step D, the sensing element 103 is cleaned by a displacement liquid 6 such as pure water and isopropyl alcohol (IPA), and the sensing element 103 is then dried while the SOI substrate 100 is revolving. The number of revolutions is determined so that a suction force 7 ($F_S$), which acts on the silicon substrate 1 by a surface tension of the displacement liquid 6, a sensor spring force $F_K$ and a centrifugal force 8 ($F_r$) generated by the acceleration in the revolution can satisfy the following condition: $(F_K+F_r)>F_S$. In the low-speed revolution that does not satisfy the condition $(F_K+F_r)>F_S$; the displacement liquid 6 such as the pure water and the IPA is sprayed to keep the sensing element coated with the resist film wet. If the condition $(F_K+F_r)>F_S$ is satisfied, the spray is stopped to dry the sensing element 103.

In order to prevent the sticking phenomenon after stopping the spray, it is preferable to dry the sensing element 103 by spraying an inert gas such as nitrogen including negative ions so that the revolving SOI substrate 100 can eliminate static electricity generated by friction of the air flow.

Figure 3A:
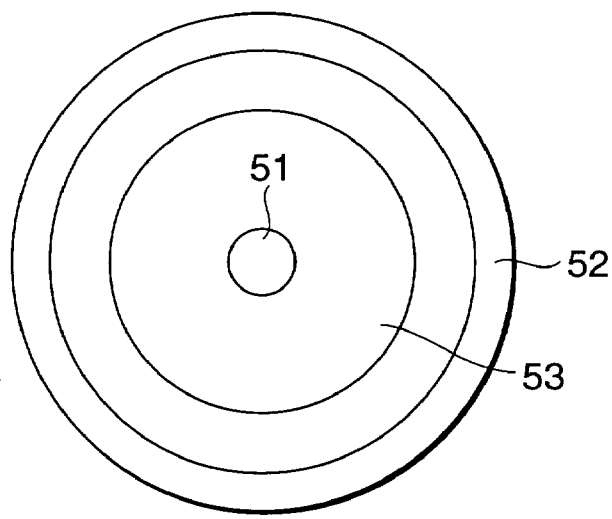
FIGS. 3(a)–(b) are views showing the essential structure of a semiconductor physical quantity sensor manufacturing apparatus according to the second embodiment of the present invention, FIG. 3(a) being a plan view of the apparatus with upper cover being taken off and FIG. 3(b) being a sectional view of the apparatus.
Figure 3B:
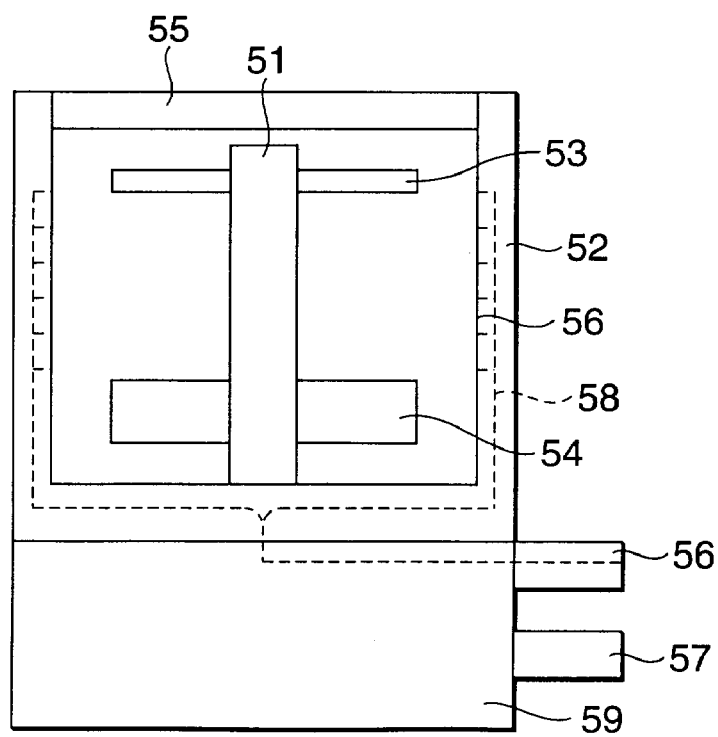

FIG. 3(b) shows the sensing element 103 dried at the step D.

Figure 8B:
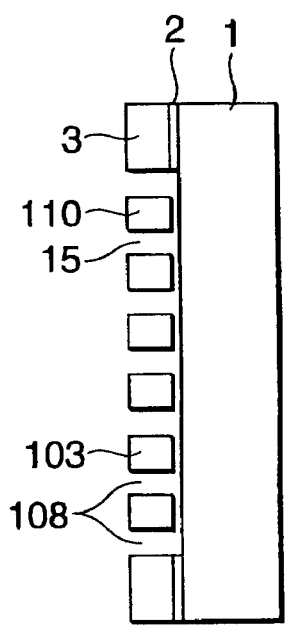
Figure 9:
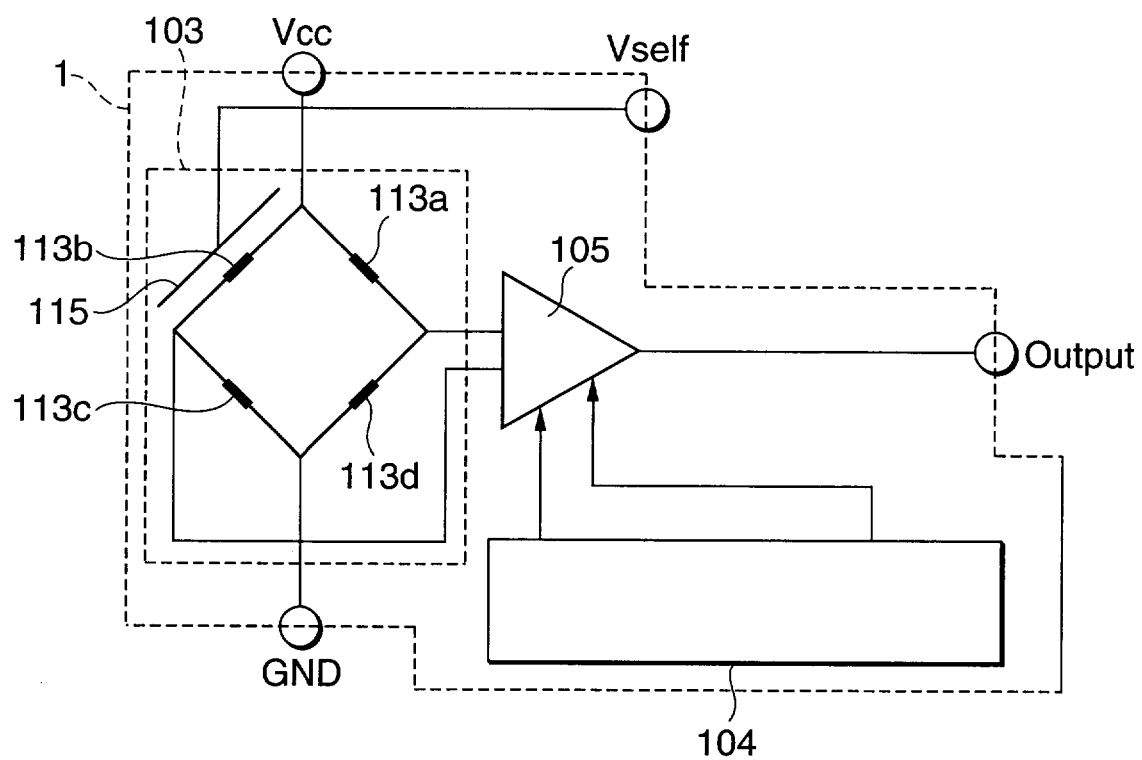
FIG. 9 is a circuit diagram showing a semiconductor physical quantity sensor.
Figure 10A:
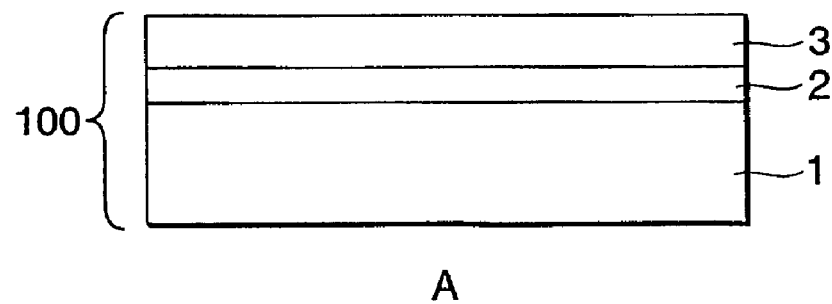
FIGS. 10(a)–(c) are sectional views showing the essential parts of the steps in a conventional semiconductor physical quantity sensor manufacturing method.
Figure 10B:
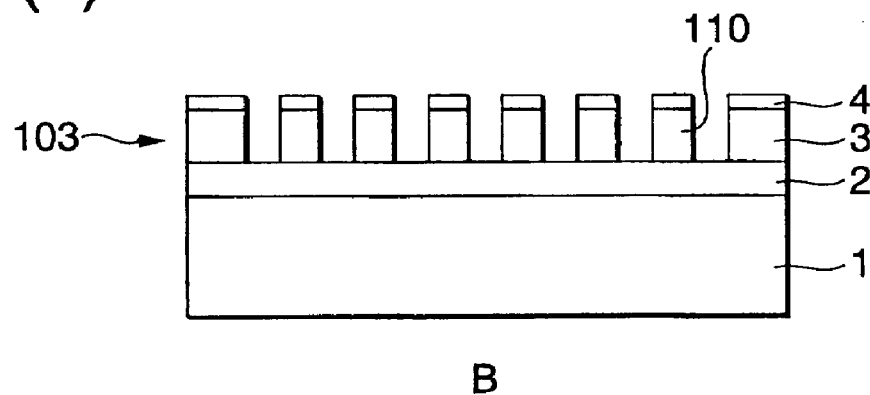
Figure 10C:
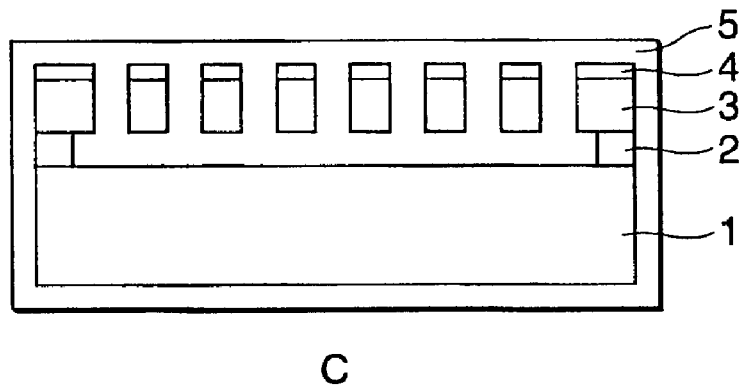
Figure 11A:
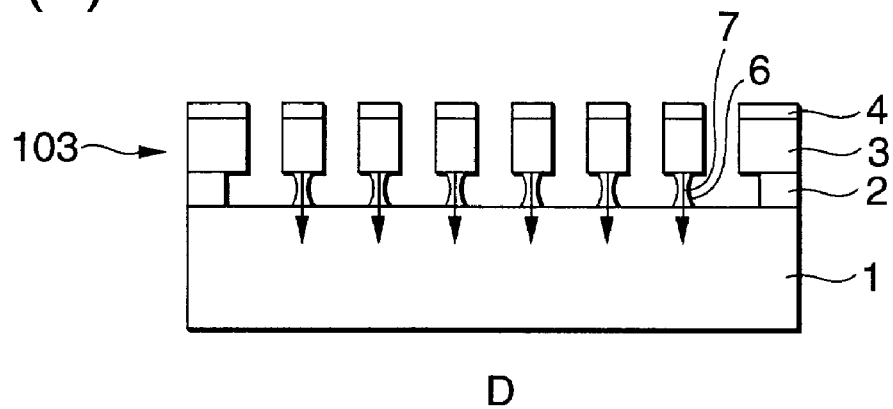
FIGS. 11(a)–(c) are sectional views showing the essential parts of the steps in a conventional semiconductor physical quantity sensor manufacturing method.
Figure 11B:
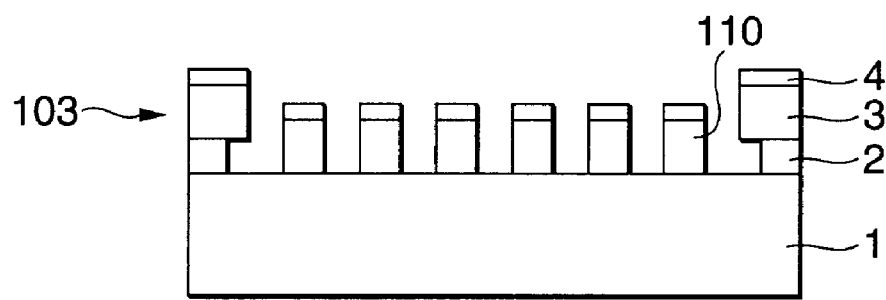
Figure 11C:
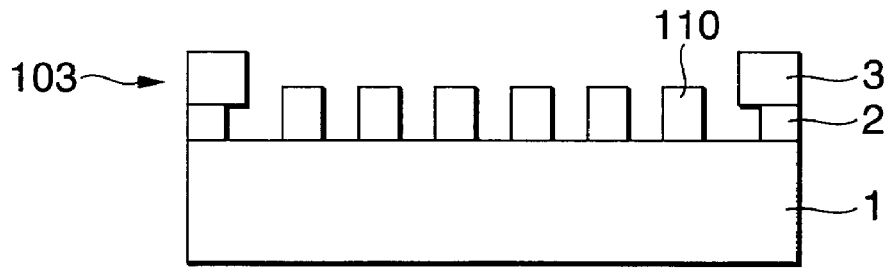
Figure 12A:
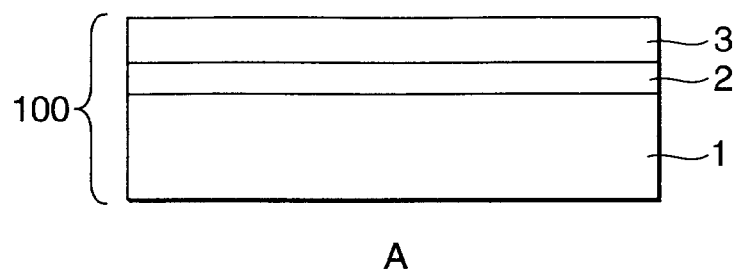
FIGS. 12(a)–(d) are sectional views showing the essential parts of the steps in a conventional semiconductor physical quantity sensor manufacturing method.
Figure 12B:
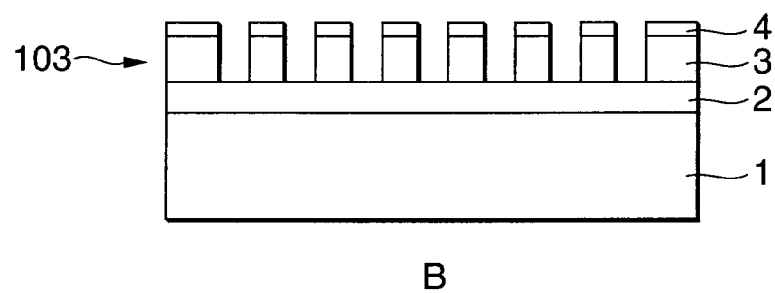
Figure 12C:
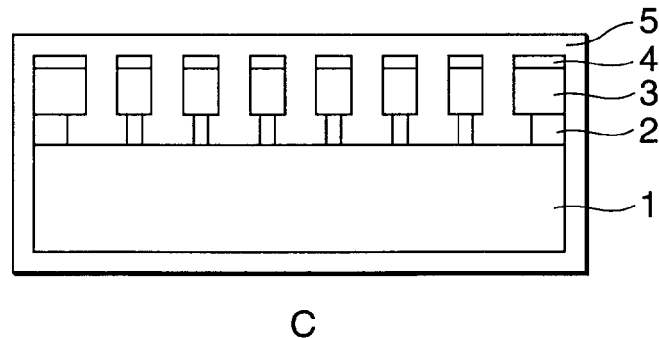
Figure 12D:
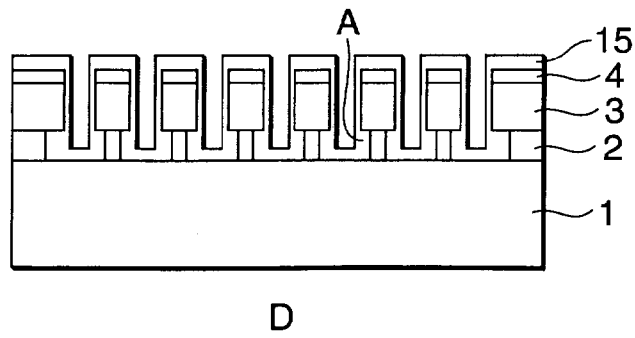
Figure 13A:
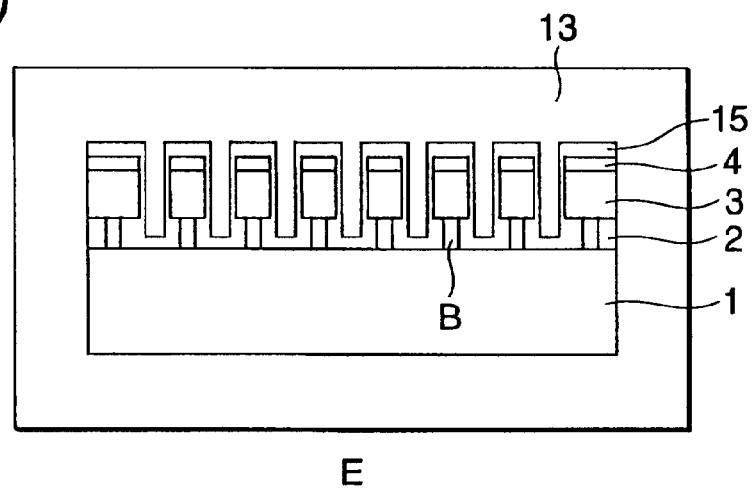
FIGS. 13(a)–(d) are sectional views showing the essential parts of the steps in a conventional semiconductor physical quantity sensor manufacturing method.
Figure 13B:
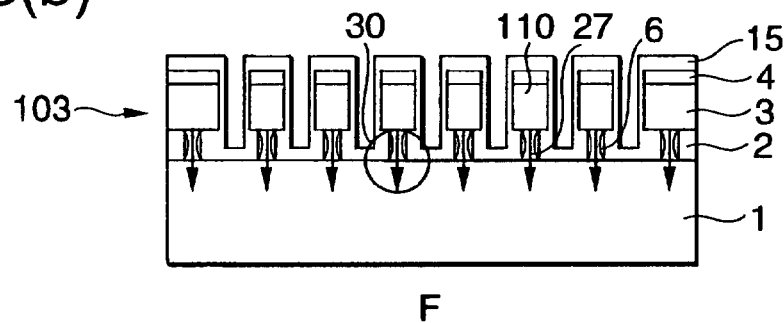
Figure 13C:
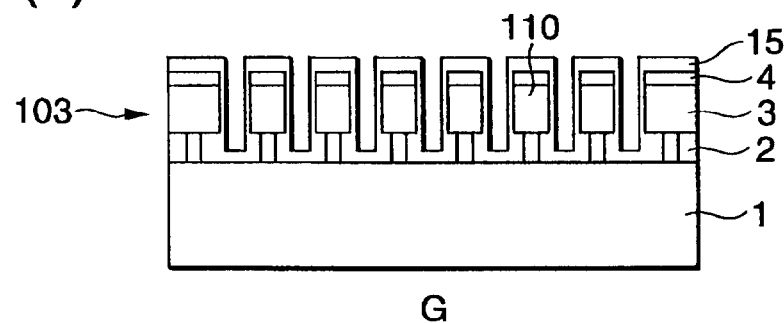
Figure 13D:
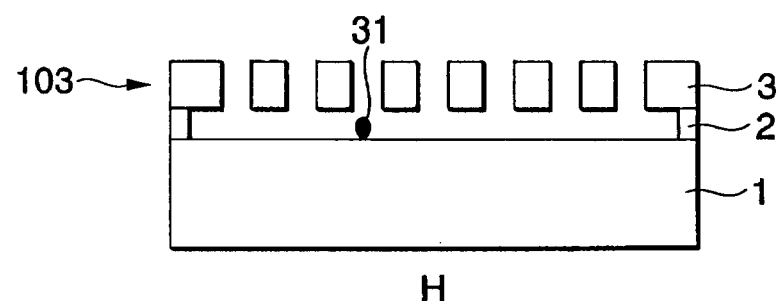
Figure 14A:
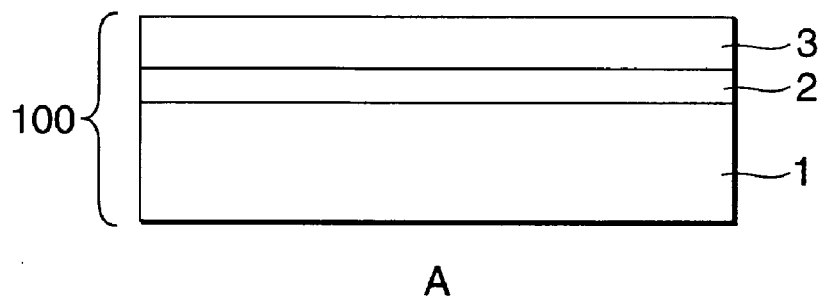
FIGS. 14(a)–(c) are sectional views showing the essential parts of the steps in a conventional semiconductor physical quantity sensor manufacturing method.
Figure 14B:
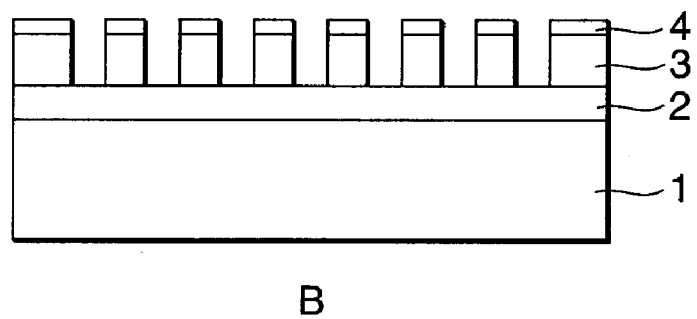
Figure 14C:
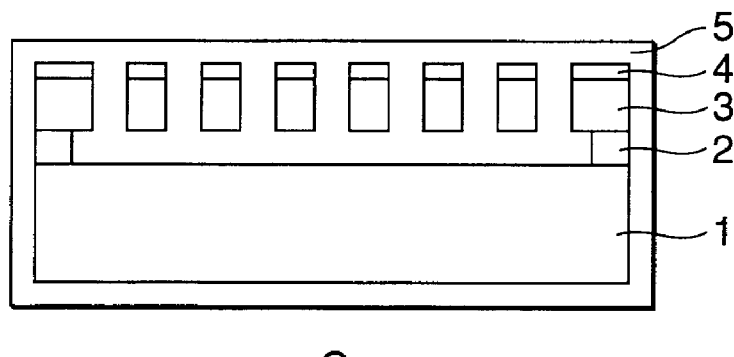
Figure 15A:
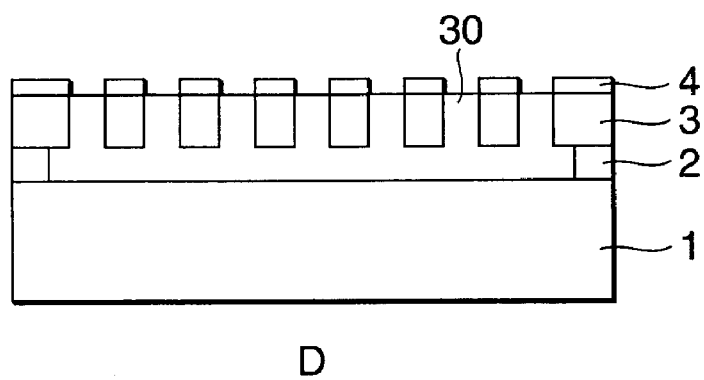
FIGS. 15(a)–(c) are sectional views showing the essential parts of the steps in a conventional semiconductor physical quantity sensor.
Figure 15B:
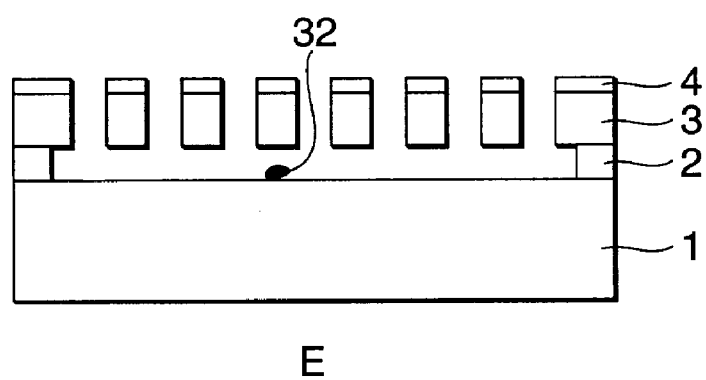
Figure 15C:
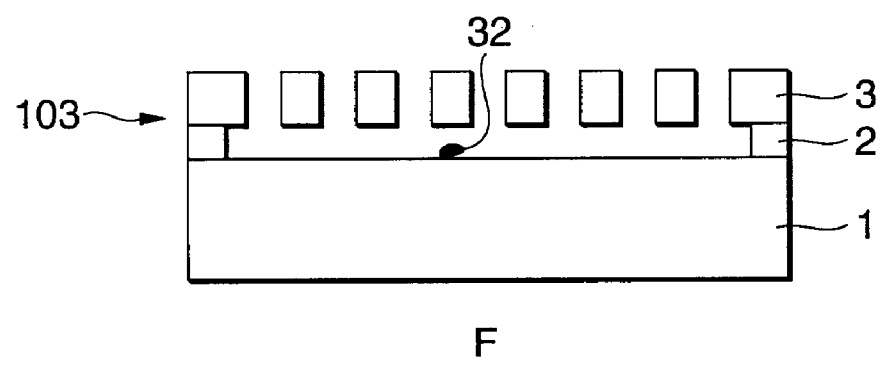

At the step F, the resist film 4 is ashen and removed in a drying process to thereby complete the sensing element 103. The section of the sensing element 103 is the same as in FIG. 8(b).

As stated above, satisfying the condition $(F_K+F_r)>F_S$ prevents the sticking phenomenon, in which the weight portions 100 of the sensing element 103 formed in the polysilicon layer with low rigidity are sucked and stuck on the silicon substrate 1. Since no photosensitive polymer or sublimate is used unlike the prior art, an alien substance or the like never remains between the weight portions 100 of the sensing element 103 and the silicon substrate 1. This improves the sensing accuracy and reliability. Moreover, the manufacturing cost can be reduced compared with the conventional method using the photosensitive polymer or the sublimation substance since there is no extra patterning process or etching process.

FIGS. 3(a) and 3(b) show the essential structure of a semiconductor physical quantity sensor manufacturing apparatus according to the second embodiment of the present invention. FIG. 3(a) is a plan view showing the apparatus with upper cover being taken off, and FIG. 3(b) is a sectional view of the apparatus. This apparatus is a drying apparatus for drying the semiconductor physical quantity sensor.

This drying apparatus has a rotary shaft 51, a drying tank 52 and a support plate 53 for fixing the SOI substrate (not shown), and the support plate 53 is secured to the rotary shaft 51. Spray holes 56 are formed in the drying tank 52, and the displacement liquid is sprayed through the spray holes 56. The rotary shaft 51 connects to a motor 59, and the spray holes 56 connect to a supply/drain inlet 56 through a supply/drain channel 58. The inert gas is supplied from an inlet 57 through a supply channel (not shown) to fill the drying tank 52.

Figure 4A:
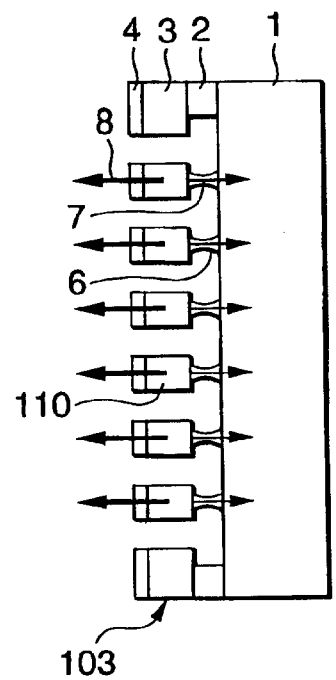
FIGS. 4(a)–(c) are views showing the state wherein a SOI substrate is mounted and a drying tank is rotated, FIG. 4(a) being a sectional view of a sensing element, FIG. 4(b) being a top plan view of a drying apparatus, and FIG. 4(c) being a sectional view of the drying apparatus.
Figure 4B:
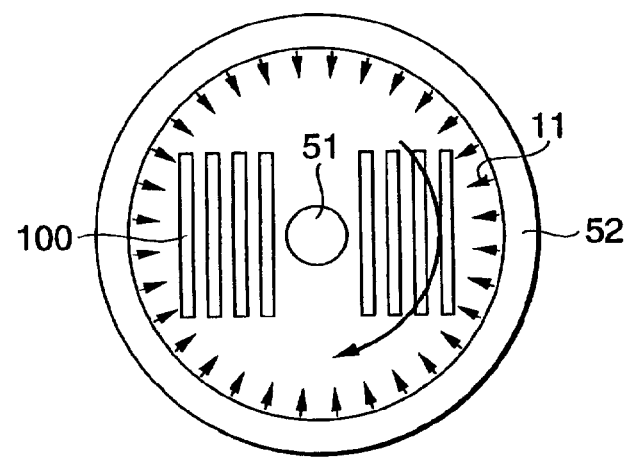
Figure 4C:
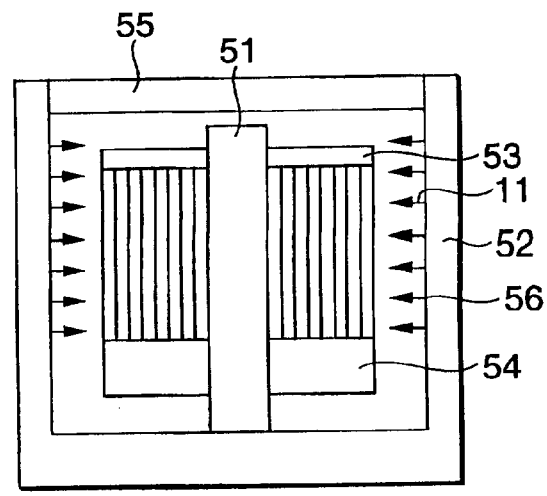

FIGS. 4(a)–(c) show the state wherein the SOI substrate is mounted in the drying apparatus, and the drying tank is rotated. FIG. 4(a) is a sectional view of the sensing element; FIG. 4(b) is a plan view of the drying apparatus taken from above; and FIG. 4(c) is a sectional view of the drying apparatus. The drying apparatus is used at the step D shown in FIG. 2. The sensing element 103 is formed in the silicon layer 3 of the SOI substrate 100. A description will now be given of the procedure for drying the SOI substrate 100 with reference to FIGS. 4(a)–(c).

1) After the etching of the oxide film 2 as the sacrifice layer, the SOI substrates 100 substituted with the displacement liquid such as the pure water and the IPA are placed axial-symmetrically about the rotary shaft 51 in such a manner that the silicon layer 3 is positioned at the outside.

2) In the low-speed revolution (which is indicated by a thick arrow in FIG. 4(b) and means the revolution, not rotation, of the SOI substrate 100 with the sensing element 103) without the desired centrifugal force 8, the displacement liquid is sprayed as indicated by an arrow 11 through the spray holes 56 to prevent the sensing element 103 from drying.

3) In the high-speed revolution with the desired centrifugal force 8, the spray of the displacement liquid is stopped, and the inert gas such as nitrogen including minus ions is sprayed to dry the SOI substrate 100 in which the sensing element 103 are formed. As shown in FIG. 4(a), the centrifugal force 8 cancels the suction force 7 generated by the surface tension of the displacement liquid 6 to thereby prevent the sticking phenomenon in which the weight portions 110 are stuck on the silicon substrate 1. The spray of the inert gas also prevents the sticking phenomenon caused by the static electricity. The sticking phenomenon may also be prevented by electrically connecting the silicon substrate 1 with the silicon layer 3 and shifting the static electricity from the silicon layer 3 to the silicon substrate 1.

The use of the drying apparatus according to the present invention easily manufactures the semiconductor physical quantity sensor at low cost in clean circumstances, and improves the sensing accuracy and reliability.

Figure 5A:
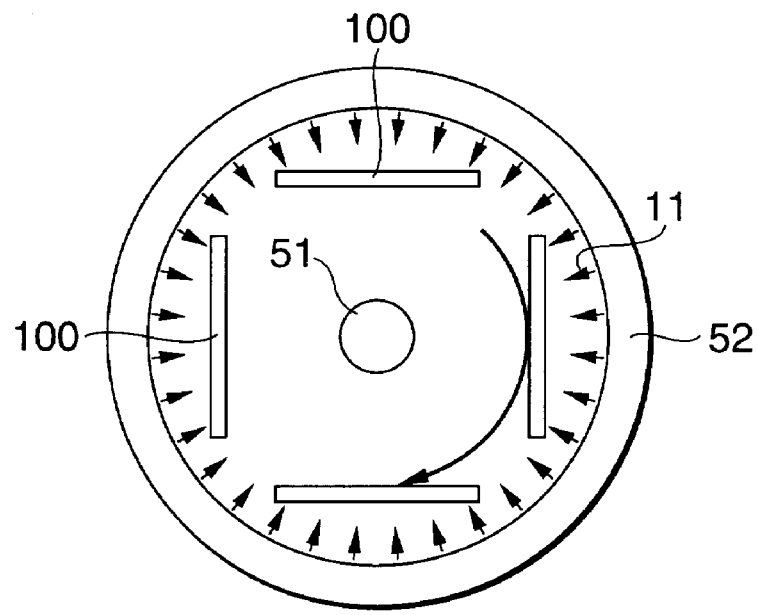
FIGS. 5(a)–(b) are views showing the essential structure of a drying apparatus according to the third embodiment of the present invention, FIG. 5(a) being a top plan view of the drying apparatus and FIG. 5(b) being a sectional view of the drying apparatus.
Figure 5B:
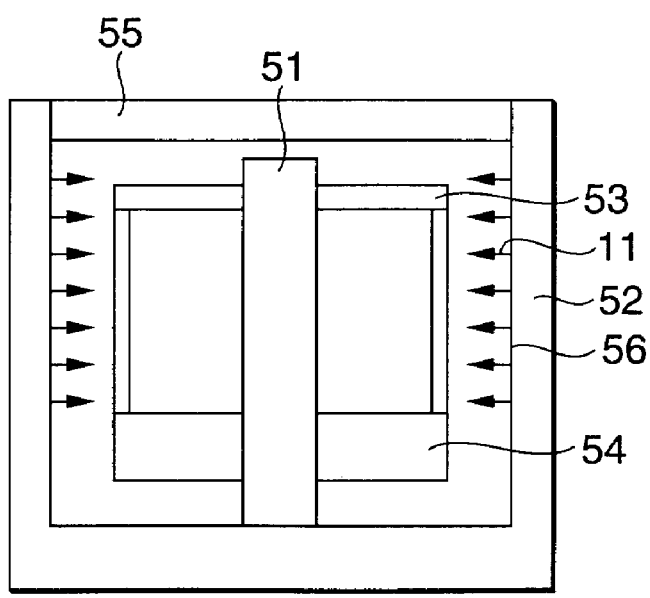

FIGS. 5(a) and 5(b) show the essential structure of a drying apparatus according to the third embodiment of the present invention. FIG. 5(a) is a plan view of the drying apparatus taken from above, and FIG. 5(b) is a sectional view of the drying apparatus. The drying apparatus is equivalent to the one in FIGS. 4(b) and 4(c).

FIGS. 5(a)–(b) are different from FIGS. 4(b)–(c) in that the SOI substrates 100 are axial-symmetrically placed at four positions. Compared with FIG. 4, the rotational balance is excellent, and the SOI substrates 100 with the sensing element 103 are dried uniformly.

Figure 6A:
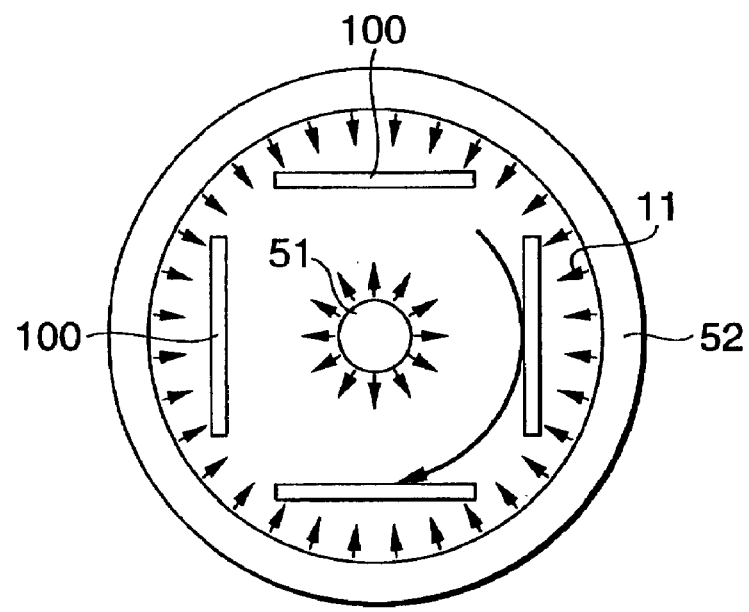
FIGS. 6(a)–(b) are views showing the essential structure of a drying apparatus according to the fourth embodiment of the present invention, FIG. 6(a) being a top plan view of the drying apparatus and FIG. 6(b) being a sectional view of the drying apparatus.
Figure 6B:
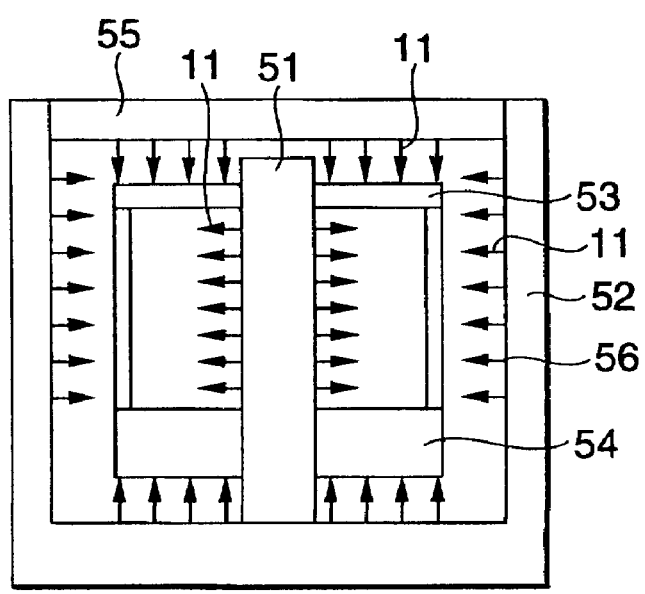

FIGS. 6(a) and 6(b) show the essential structure of the drying apparatus according to the fourth embodiment of the present invention. FIG. 6(a) is a plan view of the drying apparatus taken from above, and FIG. 6(b) is a sectional view of the drying apparatus. The drying apparatus is equivalent to the one in FIGS. 5(a) and 5(b).

FIGS. 6(a)–(b) are different from FIGS. 5(a)–(b) in that the displacement liquid is sprayed from a top cover 55 and the bottom of a drying layer 52 in addition to the rotary shaft 51 and the side walls of the drying tank 52. The sticking phenomenon can be prevented more effectively by spraying the displacement liquid from the rotary shaft, the side walls, the top cover and the bottom.

As set forth hereinabove, the present invention prevents the sticking phenomenon by generating the centrifugal force by revolving the SOI substrates with the sensing elements when the sensing element are dried.

During the low-speed revolution, the displacement liquid keeps the sensing element wet, and during the high-speed revolution, the inert gas including the minus ions is sprayed, thereby preventing the sticking phenomenon.

Furthermore, the silicon layer is electrically connected to the silicon substrate in order to shift the static electricity from the silicon layer to the silicon substrate, thereby preventing the sticking phenomenon.

Unlike the prior art, the manufacturing method and apparatus according to the present invention dry the sensing element without the use of the photosensitive polymer or the sublimation substance. This prevents the alien substance from remaining between the sensing element and the silicon substrate, and simplifies the patterning and etching. Therefore, the semiconductor physical quantity sensor with the high accuracy and reliability can be manufactured at low cost.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is clamed is:

1. A semiconductor physical quantity sensor manufacturing method using a SOI substrate composed of a silicon substrate as a first layer, an insulating layer as a second sacrifice layer formed on said first layer, and a silicon or polysilicon layer as a third layer formed on said second layer, wherein said third layer is machined to form a sensing element for sensing physical quantities and removing said second layer to form a semiconductor physical quantity sensor, said method comprising the steps of:

coating said third layer with protective film;

forming a sensing element by using said protective film as a mask;

removing said second sacrifice layer by wet etching;

substituting an etching liquid used in said wet etching with a displacement liquid;

drying said sensing element by removing said displacement liquid sticking on said sensing element in a state wherein an acceleration in an opposite direction to a direction toward said first layer is applied to said sensing element; and removing said protective film by dry etching.

2. The semiconductor physical quantity sensor manufacturing method as defined in claim 1, further comprising the step of obtaining the acceleration to be applied to said sensing element by a centrifugal force generated by revolving said SOI substrate.

3. The semiconductor physical quantity sensor manufacturing method as defined in claim 2, further comprising the step of drying said sensing element so that a suction force ($F_S$) of said sensing element against said first layer due to a surface tension of said displacement liquid, said centrifugal force ($F_r$) and a spring force $F_K$ of said sensing element can satisfy the following condition: $(F_r+F_K)>F_S$.

4. The semiconductor physical quantity sensor manufacturing method as defined in claim 3, further comprising the steps of sticking said displacement liquid on said sensing element until said acceleration reaches a predetermined value, and removing said displacement liquid and drying said sensing element after said acceleration reaches said predetermined value.

5. The semiconductor physical quantity sensor manufacturing method as defined in claim 1, further comprising the step of drying said sensing element with an inert gas.

6. The semiconductor physical quantity sensor manufacturing method as defined in claim 3, further comprising the step of drying said sensing element with an inert gas.

7. The semiconductor physical quantity sensor manufacturing method as defined in claim 4, further comprising the step of drying said sensing element with an inert gas.

8. The semiconductor physical quantity sensor manufacturing method as defined in claim 2, further comprising the step of electrically connecting said first layer with said second layer and revolving said SOI substrate.

9. The semiconductor physical quantity sensor manufacturing method as defined in claim 1, wherein said displacement liquid is vapor, pure water or isopropyl alcohol (IPA).

10. The semiconductor physical quantity sensor manufacturing method as defined in claim 3, wherein said displacement liquid is vapor, pure water or isopropyl alcohol (IPA).

11. The semiconductor physical quantity sensor manufacturing method as defined in claim 4, wherein said displacement liquid is vapor, pure water or isopropyl alcohol (IPA).

* * * * *

UNITED STATES PATENT AND TRADEMARK OFFICE
CERTIFICATE OF CORRECTION

PATENT NO.    : 6,281,033 B1
DATED         : August 28, 2001
INVENTOR(S)   : Katsumichi Ueyanagi et al.

It is certified that error appears in the above-identified patent and that said Letters Patent is hereby corrected as shown below:

<u>Title page,</u>
Item [75], Inventor, please delete "Uayanagi" and insert -- Ueyanagi --.

Signed and Sealed this

Twenty-seventh Day of May, 2003

JAMES E. ROGAN
*Director of the United States Patent and Trademark Office*